(12) United States Patent
Iwasaki et al.

(10) Patent No.: US 10,746,535 B2
(45) Date of Patent: Aug. 18, 2020

(54) INSPECTING DEVICE AND METHOD FOR COMPONENT WITH TWO WIRES

(71) Applicant: KAWASAKI JUKOGYO KABUSHIKI KAISHA, Kobe-shi, Hyogo (JP)

(72) Inventors: Yukio Iwasaki, Kobe (JP); Satoru Hibino, Kobe (JP); Kazunori Hirata, Yao (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 16/097,536

(22) PCT Filed: Apr. 28, 2017

(86) PCT No.: PCT/JP2017/017094
§ 371 (c)(1),
(2) Date: Oct. 29, 2018

(87) PCT Pub. No.: WO2017/188454
PCT Pub. Date: Nov. 2, 2017

(65) Prior Publication Data
US 2019/0154436 A1 May 23, 2019

(30) Foreign Application Priority Data
Apr. 28, 2016 (JP) .................. 2016-091632

(51) Int. Cl.
*G01B 11/24* (2006.01)
*H05K 13/08* (2006.01)
(Continued)

(52) U.S. Cl.
CPC ............. *G01B 11/24* (2013.01); *G01N 21/95* (2013.01); *G01N 21/952* (2013.01); *H05K 13/0812* (2018.08); *H05K 13/0813* (2018.08)

(58) Field of Classification Search
CPC ... G01B 11/24; G01B 11/2433; G01B 11/245; G01B 11/30; G01B 11/303;
(Continued)

(56) References Cited

U.S. PATENT DOCUMENTS 3,956,629 A * 5/1976 Gomm ...................... B07C 5/10
382/141
4,553,843 A * 11/1985 Langley ............. H05K 13/0813
356/621
(Continued)

FOREIGN PATENT DOCUMENTS

JP        S56-124001 A      9/1981
JP        S56-143902 A     11/1981
(Continued)

OTHER PUBLICATIONS

Jul. 18, 2017 Search Report issued in International Patent Application No. PCT/JP20171017094.

*Primary Examiner* — Gordon J Stock, Jr.
(74) *Attorney, Agent, or Firm* — Oliff PLC

(57) ABSTRACT

A component inspecting device inspects presence or absence of an abnormal state of two linear wires based on changes in the amount of received light of a first light ray and a second light ray received by a first light receiver and a second light receiver, respectively when a component is moved such that the two linear wires in the normal state block the first light ray and the second light ray in a posture wherein an arrangement direction of the two linear wires crosses optical axes of the first light ray of the first light projector and the second light ray of the second light projector. This device can detect an abnormality such as a bend or the like of linear wires by a simple configuration and a simple operation in a component having two linear wires which have axis directions parallel to each other and have different lengths.

11 Claims, 7 Drawing Sheets

(51) Int. Cl.
*G01N 21/95* (2006.01)
*G01N 21/952* (2006.01)

(58) Field of Classification Search
CPC .......... G01B 11/306; G01N 21/8806; G01N 21/952; G01N 2021/8829; G01N 21/95; H05K 13/0815; H05K 13/08; H05K 13/0813; H05K 13/0814
See application file for complete search history.

(56) References Cited

U.S. PATENT DOCUMENTS

| | | | |
|---|---|---|---|
| 4,598,456 A | | 7/1986 | McConnell |
| 4,696,047 A | * | 9/1987 | Christian ............... G01R 31/04 348/126 |
| 4,728,195 A | * | 3/1988 | Silver ................ H05K 13/0815 356/394 |
| 4,745,295 A | * | 5/1988 | Seno .................... G01B 11/024 250/559.24 |
| 4,821,157 A | * | 4/1989 | Birk ...................... H05K 13/023 362/241 |
| 5,309,223 A | * | 5/1994 | Konicek ............ H05K 13/0813 356/621 |
| 5,648,853 A | * | 7/1997 | Stern ....................... H01L 22/12 257/E21.53 |
| 6,118,538 A | * | 9/2000 | Haugan ............... H05K 13/0812 356/623 |
| 6,128,074 A | * | 10/2000 | Hong ...................... H01L 22/12 257/E21.53 |
| 6,222,629 B1 | * | 4/2001 | Morris ............... G01B 11/2433 356/601 |
| 6,229,608 B1 | * | 5/2001 | Morris ............... H05K 13/0813 356/623 |
| 6,738,504 B1 | * | 5/2004 | Higashi ............ H01L 21/67259 257/E21.528 |
| 8,028,405 B2 | * | 10/2011 | Nolleck ................. G01B 11/26 29/842 |
| 9,555,549 B2 | * | 1/2017 | Motoyoshi ............. B25J 9/1697 |
| 2008/0204764 A1 | | 8/2008 | Kimura |
| 2010/0306998 A1 | | 12/2010 | Nolleck et al. |

FOREIGN PATENT DOCUMENTS

| | | |
|---|---|---|
| JP | H02-290504 A | 11/1990 |
| JP | H04-071104 U | 6/1992 |
| JP | H04-196455 A | 7/1992 |
| JP | H06-37492 A | 2/1994 |
| JP | H06-188600 A | 7/1994 |
| JP | 2008-209308 A | 9/2008 |
| WO | 2015/071929 A1 | 5/2015 |
| WO | WO-2018225777 A1 * | 12/2018 ............. B25J 13/00 |

* cited by examiner (a)

(b)

(a)

(b)

INSPECTING DEVICE AND METHOD FOR COMPONENT WITH TWO WIRES

TECHNICAL FIELD

The present invention relates to an inspecting device and an inspecting method for inspecting, in a component having two linear wires having mutually parallel axes and different lengths, the presence or absence of an abnormality such as a bend, a defect or the like of the linear wires. For example, it inspects the presence or absence of an abnormality such as a bend, a defect or the like of lead wires of an electric component having the lead wires with polarity.

BACKGROUND ART

In recent years, there is an increasing need for assembling and manufacturing electric products by combining electronic components and the like using an automatic machine such as a robot. In such assembly of electric products or the like, for example, when incorporating an electric component having a lead wire in a circuit substrate, it is necessary to insert the lead wire into an insertion hole of the circuit substrate by an automatic machine such as a robot. However, if there is an abnormality such as a bend, a defect or the like in the lead wire, the lead wire cannot be inserted into the insertion hole of the circuit substrate.

With respect to such abnormality as deformation of the lead wire, for example, Patent Document 1 proposes a device which uses a lead wire recognition camera 15 for the lead wire of an electronic component 1, a substrate insertion hole recognition camera 16 and the like so as to correct the lead wire according to deviation or the like of the lead wire, so that the lead wire is inserted into the insertion hole of the substrate.

Further, Patent Document 2 proposes a device which moves, with respect to two beams crossing each other, so as to block the two beams from three different directions, thereby detecting the position of the lead wire.

However, in the device described in Patent Document 1, there is a problem that expensive cameras are used and advanced image processing is required, which is expensive and complicates the system. Further, in the device described in Patent Document 2, there is a problem that large number of movement operations are required for two beams and the detection time becomes longer, and therefore the cycle time of the assembly of electric products becomes longer.

CITATION LIST

Patent Document

[Patent Document 1] Japanese Patent Application Laid-open No. H06-37492
[Patent Document 2] Japanese Patent Application Laid-open No. H06-188600

SUMMARY OF INVENTION

Objects to be Achieved by the Invention

The present invention is made considering the above-mentioned problems of the conventional technology, and its object is to provide a component inspecting device and method which can detect an abnormality such as a bend, a defect or the like of linear wires by a simple configuration and a simple operation in a component having two linear wires which have axis directions parallel to each other and have different lengths.

Means for Achieving the Objects

In order to achieve the above-mentioned objects, a first aspect of the present invention is a component inspecting device for inspecting a component having two linear wires which have axis directions parallel to each other and have different lengths, comprising: a moving device for holding and linearly moving the component in a direction substantially orthogonal to an axis direction of the linear wire; a first light measuring device having a first light projector for irradiating a first light ray to a position of a tip end portion of a short wire among the two linear wires in a normal state, and a first light receiver for receiving the first light ray; and a second light measuring device having a second light projector for irradiating a second light ray whose optical axis is parallel to the first light ray to a position of a tip end portion of a long wire among the two linear wires in a normal state, and a second light receiver for receiving the second light ray; the device inspecting presence or absence of an abnormal state of the two linear wires based on changes in the amount of received light of the first light ray and the second light ray received by the first light receiver and the second light receiver, respectively when the component is moved such that the two linear wires in the normal state block the first light ray and the second light ray in a posture in which an arrangement direction of the two linear wires crosses optical axes of the first light ray and the second light ray.

A second aspect of the present invention is that, in the first aspect, an irradiation direction of the first light ray and an irradiation direction of the second light ray are set opposite to each other.

A third aspect of the present invention is that, in the first or second aspect, a gap between the short wire and the long wire in a direction in which the component is linearly moved is twice or more the width of the first light ray or the second light ray.

A fourth aspect of the present invention is that, in any one of the first to third aspects, for each of the short wire and the long wire, a decrease amount in the amount of received light of the first light ray and the second light ray in a maximum allowable deformation amount of a tip end portion of the linear wire when the component is moved so that the two linear wires block the first light ray and the second light ray is obtained in advance as a limit decrease amount, wherein it is determined as abnormal when the decrease amount in the amount of received light of at least one of the first light ray and the second light ray is smaller than the limit decrease amount.

A fifth aspect of the present invention is that, in any one of the first to fourth aspects, the moving device is a robot for holding the component and performing assembly work.

A sixth aspect of the present invention is that, in any one of the first to fifth aspects, the component is an electric component and the linear wire is a lead wire having a polarity of the electric component.

In order to achieve the above-mentioned objects, a seventh aspect of the present invention is a component inspecting method for inspecting a component having two linear wires which have axis directions parallel to each other and have different lengths, comprising: a moving step of linearly moving the component in a direction substantially orthogonal to the axis direction of the linear wire, a first light measuring step of irradiating a first light ray to a position of a tip end portion of a short wire among the two linear wires in a normal state to obtain a change in the amount of received light of the first light ray blocked by the short wire, a second light measuring step of irradiating a second light ray whose optical axis is parallel to the first light ray to a position of a tip end portion of a long wire among the two linear wires in a normal state to obtain a change in the amount of received light of the second light ray blocked by the long wire, a determining step of determining presence or absence of an abnormality of the two linear wires based on changes in the amount of received light of the first and second light rays obtained by the first and second light measuring steps, respectively, wherein, in the moving step, the component is moved in a posture in which an arrangement direction of the two linear wires crosses optical axes of the first light ray and the second light ray, and wherein the first and second light measuring steps are executed in parallel with the moving step.

An eighth aspect of the present invention is that, in the seventh aspect, an irradiation direction of the first light ray and an irradiation direction of the second light ray are set opposite to each other.

A ninth aspect of the present invention is that, in the sixth or seventh aspect, a gap between the short wire and the long wire in a direction in which the component is linearly moved is twice or more the width of the first light ray or the second light ray.

A tenth aspect of the present invention comprises, in any one of the seventh to ninth aspects, a limit decrease amount obtaining step of, for each of the short wire and the long wire, obtaining a decrease amount in the amount of received light of the first light ray and the second light ray in a maximum allowable deformation amount of a tip end portion of the linear wire when the component is moved so that the two linear wires block the first light ray and the second light ray in advance as a limit decrease amount, before the moving step, wherein, in the determining step, it is determined as abnormal when the decrease amount in the amount of received light of at least one of the first light ray and the second light ray is smaller than the limit decrease amount.

An eleventh aspect of the present invention is that, in any one of the seventh to tenth aspects, the moving step is executed by a robot for holding the component and performing assembly work.

A twelfth aspect of the present invention is that, in any one of the seventh to eleventh aspects, the component is an electric component and the linear wire is a lead wire having a polarity.

Advantageous Effect of the Invention

According to the present invention, there can be provided a component inspecting device and method which can detect an abnormality such as a bend, a defect or the like of linear wires by a simple configuration and a simple operation in a component having two linear wires which have axis directions parallel to each other and have different lengths.

EMBODIMENT OF THE INVENTION

First Embodiment

Figure 1:
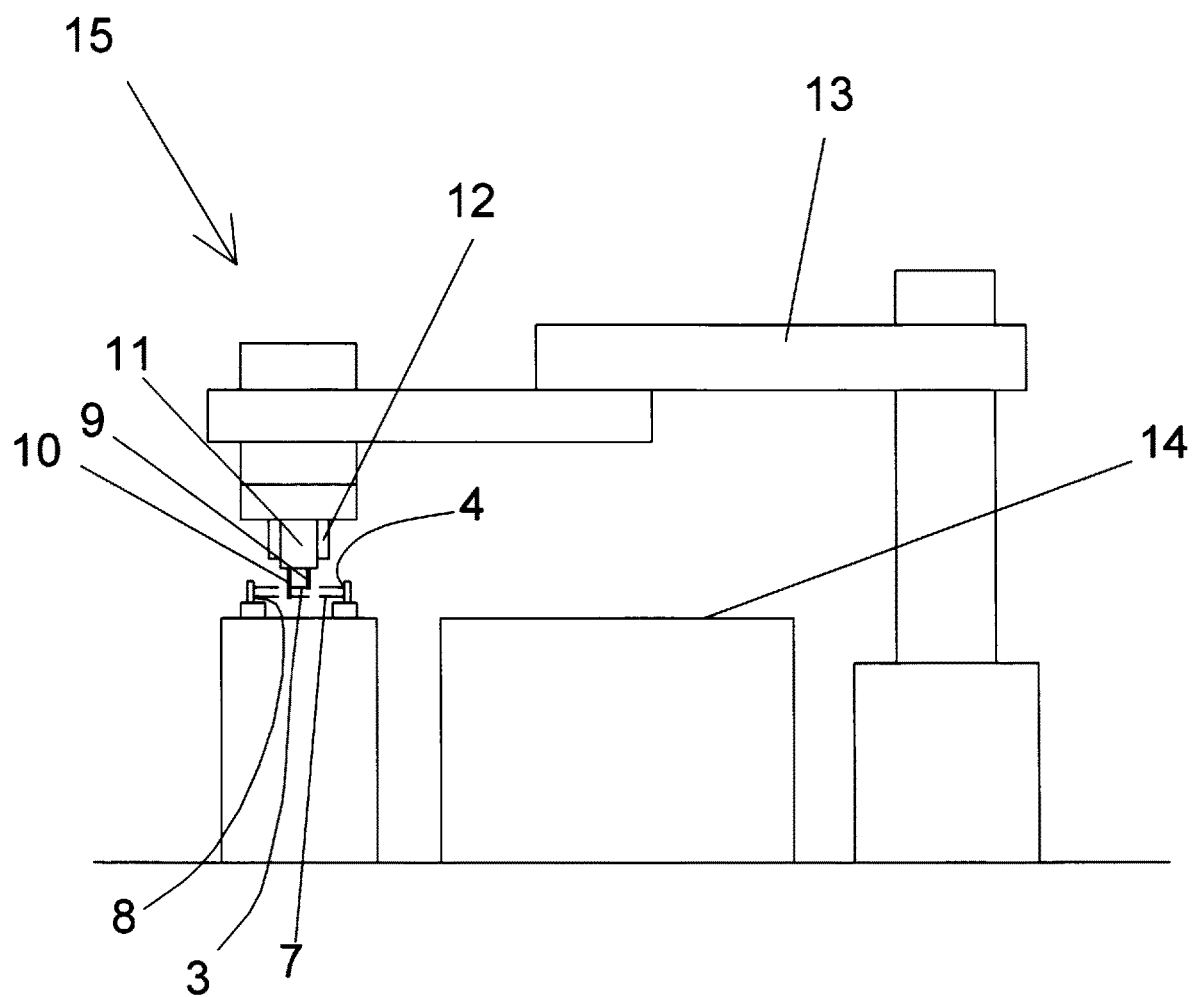
FIG. 1 a conceptual diagram illustrating a configuration of a first embodiment of a component inspecting device according to the present invention.

Hereunder, a first embodiment of a component inspecting device and method according to the present invention will be described referring to the drawings.

Figure 2:
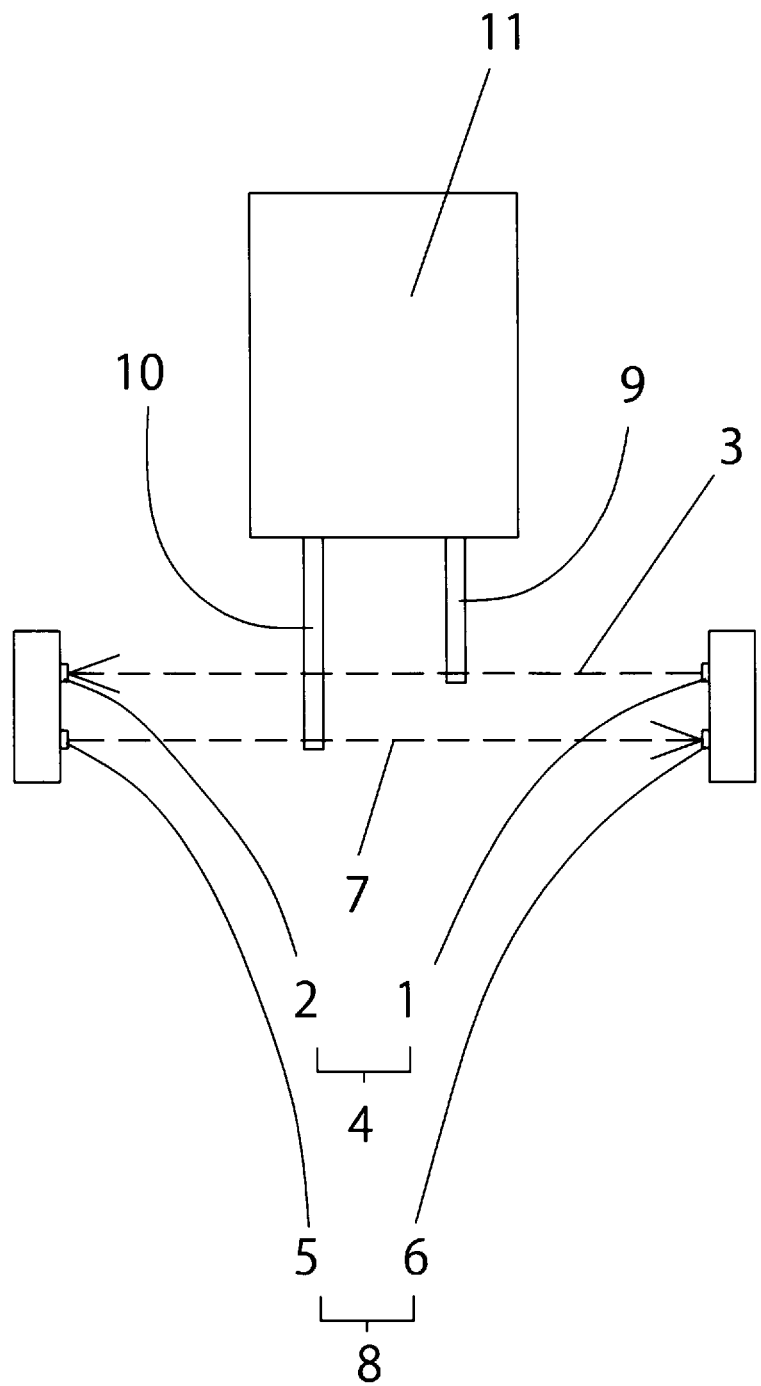
FIG. 2 is a front view illustrating the relationship between lead wires of an electric component and arrangement of light rays.

FIG. 1 is a conceptual diagram illustrating a configuration of the component inspecting device according to the first embodiment. FIG. 2 is a front view illustrating the relationship between two lead wires (short lead wire 9 and long lead wire 10) of an electric component 11 and two light rays (first light ray 3 and second light ray 7) in the first embodiment.

A component inspecting device 15 of this embodiment inspects the presence or absence of an abnormality such as a bend, a defect or the like of two lead wires with polarity (generally, the longer one is the positive electrode/anode, the shorter one is the negative electrode/cathode) of an electric component 11 having the short lead wire 9 and the long lead wire 10 which are axially parallel to each other such as a semiconductor device and an electric double layer capacitor, for example. Note that, it is sufficient that the electric component 11 has at least two lead wires having different lengths.

The component inspecting device 15 comprises an articulated robot 13 which linearly moves the electric component 11 in a horizontal plane by a gripper 12 of its hand, while the tip end of the short lead wire 9 or the long lead wire 10 is held vertically downward, a first light measurement device 4 having a first light projector 1 for irradiating the first light ray 3 and a first light receiver 2 for receiving the first light ray 3 on a tip end portion of the short lead wire 9, and a second light measurement device 8 having a second light projector 5 for irradiating the second light ray 7 and a second light receiver 6 for receiving the second light ray 7 on a tip end portion of the long lead wire 10.

Note that, although laser light with high measurement accuracy is employed as the first light ray 3 and the second light ray 7, it is not limited to laser light and may be LED light or the like.

A work table 14 is provided adjacent to the component inspecting device 15, and an assembly work of electric components and the like is performed on the work table 14 by an automatic machine such as an articulated robot.

Figure 3:
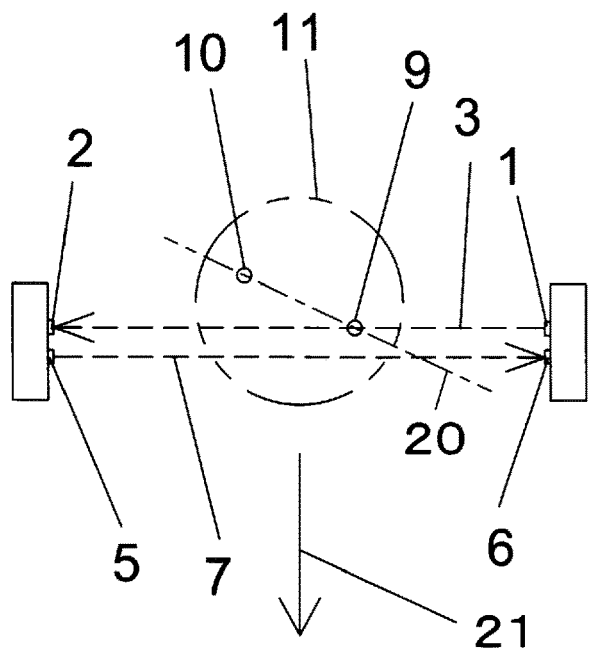
FIG. 3 is a plan view illustrating the relationship between the lead wires and light rays in the first embodiment, (a) illustrating a state in which a short lead wire blocks a first light ray, (b) illustrating a state in which a long lead wire blocks a second light ray.
Figure 3:
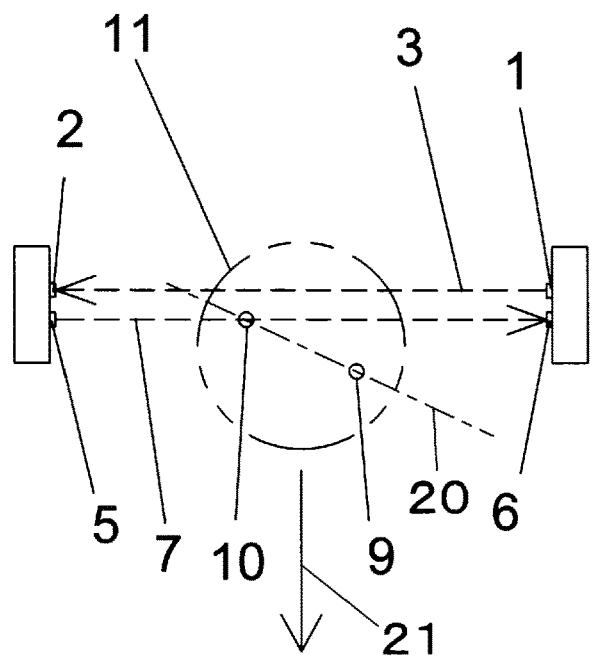
Figure 4:
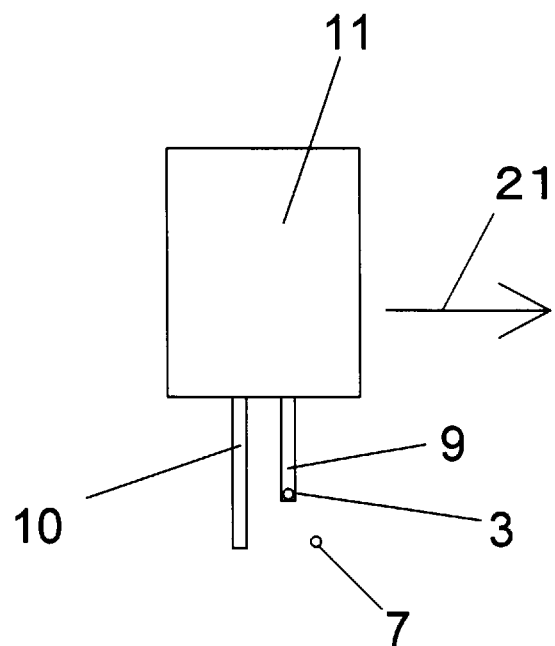
FIG. 4 is a left side view illustrating the relationship between the lead wires and light rays in the first embodiment, (a) illustrating a state in which the short lead wire blocks the first light ray (corresponding to FIG. 3 (a)), (b) illustrating a state in which the long lead wire blocks the second light ray (corresponding to FIG. 3 (b)).
Figure 4:
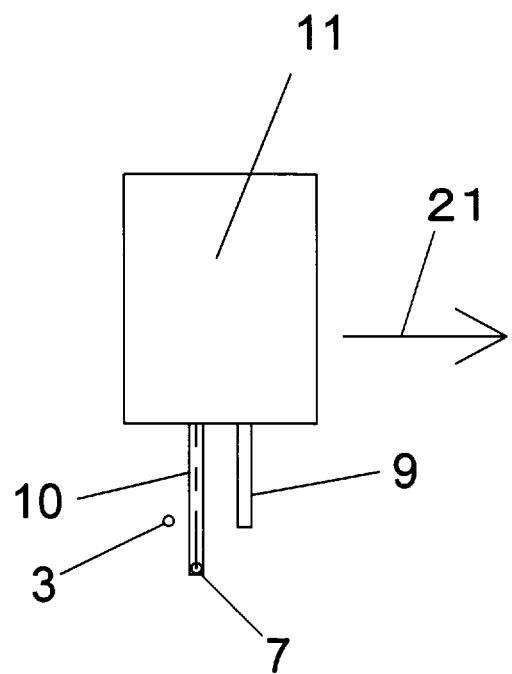

FIG. 3 is a plan view illustrating the relationship between the lead wires (short lead wire 9 and long lead wire 10) and light rays (first light ray 3 and second light ray 7) in the first embodiment, (a) illustrating the state in which the short lead wire 9 blocks the first light ray 3, (b) illustrating the state in which the long lead wire 10 blocks the second light ray 7. Additionally, FIG. 4 is a left side view illustrating the relationship between the lead wires (short lead wire 9 and long lead wire 10) and light rays (first light ray 3 and second light ray 7) in the first embodiment, (a) illustrating the state in which the short lead wire 9 blocks the first light ray 3 (corresponding to FIG. 3 (a)), (b) illustrating the state in which the long lead wire 10 blocks the second light ray (corresponding to FIG. 3 (b)).

Optical axes of the first light ray 3 and the second light ray 7 are parallel to each other, and the electric component 11 is horizontally moved along a movement direction 21 in a posture in which an arrangement direction 20 of the short lead wire 9 and the long lead wire 10 crosses the direction of the optical axes of the first light ray 3 and the second light ray 7 (refer to FIGS. 3 (a) and (b)).

The detection of the presence or absence of an abnormality such as a bend, a defect or the like of the short lead wire 9 and the long lead wire 10 is performed based on change in the amount of received light of the first light ray 3 and the second light ray 7 received by the first light receiver 2 and the second light receiver 6, which is obtained by horizontally moving the electric component 11 such that the tip end portions of the short lead wire 9 and the long lead wire 10 respectively block the first light ray 3 and the second right ray 7.

For example, if the long lead wire 10 is largely bent or damaged and it does not block the second light ray 7, the amount of received light of the second right ray received by the second light receiver 6 does not change even when moving the electric component 11, and therefore abnormality due to a bend and a defect can be detected.

Further, if the bend of the long lead wire 10 is small but the bend has a predetermined size or more, the light blocking amount of the second light blocked by the tip end portion of the long lead wire 10 becomes small and the change in the amount of received light (decrease amount) of the second light received by the second light receiver 6 is small. Therefore, the amount of received light of the second light ray 7 is decreased or increased depending on increase or decrease of the bending size, respectively.

Therefore, since the bending size of the short lead wire 9 or the long lead wire 10 can be estimated based on the decrease amount of the received light amount of the first light ray 3 or the second light ray 7, the presence or absence of an abnormality of the short lead wire 9 or the long lead wire 10 can be determined based on the decrease amount of the received light amount of the first light ray 3 or the second light ray 7.

Note that, in order to detect the bending size of the lead wires 9, 10 with high accuracy, it is preferable to irradiate the first light ray 3 and the second light ray 7 to the position close to the tip ends of the lead wires 9, 10. Accordingly, the position of the tip end portion in the short lead wire 9 to which the first light ray 3 is irradiated is set in a range that the distance from the tip end of the short lead wire 9 is the diameter of the short lead wire 9 or less, and the position of the tip end portion in the long lead wire 10 to which the second light ray 7 is irradiated is set in a range that the distance from the tip end of the long lead wire 10 is the diameter of the long lead wire 10 or less.

Further, the detection of the presence or absence of an abnormality such as a bend, a defect or the like of the short lead wire 9 and the long lead wire 10 is performed by linearly moving the electric component 11 by the articulated robot 13 at a predetermined speed from a movement start position which is previously set in a horizontal plane, in a posture in which the arrangement direction 20 of the short lead wire 9 and the long lead wire 10 crosses the direction of the optical axes of the first light ray 3 and the second light ray 7.

Therefore, the time point at which the short lead wire 9 and the long lead wire 10 block the first light ray 3 and the second light ray 7 respectively are different from each other (refer to FIG. 3, 4). Accordingly, at the time point when the short lead wire 9 passes through (blocks) the first light ray 3 for example, the long lead wire 10 is not in a position blocking the first light ray, and therefore, when the short lead wire 9 has an abnormality and the long lead wire 10 is normal, the first light ray 3 is not blocked by the long lead wire 10 and so an abnormality of the short lead wire 9 is not falsely determined.

Note that, in FIG. 3, the first light ray 3 is arranged above the second light ray 7 in the page, and the movement start position of the electric component 11 is above the first light ray 3 in the page, and the electric component 11 is set to linearly move toward the lower side of the page. In contrast, in FIG. 3, the movement start position of the electric component 11 may be below the second light ray 7 in the page while the arrangement of the first light ray 3 and the second light ray 7 is the same, and the electric component 11 may be set to linearly move toward the upper side of the page. Referring to FIG. 4, while the electric component 11 is set to move from left to right in the page of FIG. 4, it may be set to move from right to left corresponding to the description above.

Additionally, even when the arrangement direction 20 of the short lead wire 9 and the long lead wire 10 crosses the direction of the optical axes of the first light ray 3 and the second light ray 7 in the horizontal plane, if the angle of crossing is small, for example, the identification of the state in which the first light ray 3 is blocked by the short lead wire 9 and the long lead wire 10 may be insufficient.

Therefore, in order to increase the accuracy of abnormality detection, it is preferable to set the crossing angle to a predetermined size or more. Therefore, in the first embodiment, the interval between the short lead wire 9 and the long lead wire 10 in the direction in which the component is linearly moved is set to be twice or more the width of the first light ray 3 (horizontal length of the light ray in the cross section perpendicular to the optical axis). For example, the above-mentioned crossing angle is set to 45°.

Further, in this embodiment, the irradiation directions of the first light ray 3 and the second light ray 7 are set in opposite directions. This is to prevent, when the separation distance between the first light ray 3 and the second light ray 7 is short and the irradiation directions of the first light ray 3 and the second light ray 7 are the same, for example, the second light receiving section 6 from receiving a part of the first light ray 3 (or conversely, the first light receiving portion from receiving a part of the second light ray 7) due to diffusion of light rays or the like thereby causing an error in the amount of received light or the like. However, when such an error does not occur, the irradiation directions of the first light ray 3 and the second light ray 7 may be set in the same direction.

Next, a method of detecting abnormality of the short lead wire 9 and the long lead wire 10 of the electric component 11 by using the component inspecting device 15 will be described.

(1) The change amount (decrease amount) in the amount of received light received by the light receiver (first light receiver 2 and second light receiver 6) corresponding to a bend, a defect, and the like which are determined to be abnormal in the lead wires (short lead wire 9 and long lead wire 10) is obtained by calculation, analysis or experiment.

For example, if the short lead wire 9 is largely deformed, the first light ray 3 is not blocked by the short lead wire 9, and therefore there is no change (decrease) in the amount of received light received by the first light receiver 6. Additionally, if the short lead wire 9 is slightly deformed, the first light ray 3 is partly blocked by the tip end portion of the short lead wire 9, however, the light blocking amount is smaller than that in the case where the short lead wire 9 is normal. Accordingly, the change in the amount of received light (decrease amount) received by the first light receiver 6 is smaller than that in the case where the short lead wire 9 is normal.

Accordingly, the decrease amount (hereinafter referred to as "limit decrease amount") of the amount of received light received by the light receiver corresponding to the deformation amount allowed at the tip end portion of the lead wire when the electric component 11 is incorporated in a circuit substrate or the like is obtained by calculation, analysis or experiment.

Therefore, when each tip end portion of the short lead wire 9 and the long lead wire 10 passes through the first light ray 3 and the second light ray 7, if the decrease amount in the amount of received light received by the first light receiver 2 and the second light receiver 5 is smaller than the limit decrease amount respectively, it is determined that the lead wire has deformation (abnormality) which is equal to or larger than the allowable value.

Note that, as mentioned above, the electric component 11 is moved in a posture in which the arrangement direction 20 of the short lead wire 9 and the long lead wire 10 crosses the optical axis of the first light ray 3 or the second light ray 7. Therefore, at the time when the short lead wire 9 passes through the first light ray 3, the long lead wire 10 does not pass through the first light ray 3 at the same time, and even if the short lead wire 9 is largely deformed, an erroneous judgment will not be made due to blocking of the first light ray 3 by the long lead wire 10.

(2) The electric component 11 is linearly moved in the horizontal plane so that the short lead wire 9 and the long lead wire 10 respectively block the first light ray 3 and the second light ray 7 to obtain the change in the amount of received light (decrease amount) received by the first light receiver 2 and the second light receiver 6.

The linear movement of the electric component 11 is performed by the articulated robot 13 and is executed by operating the robot at a preset speed between the preset movement start position and movement end position.

Additionally, the electric component 11 is moved in a posture in which the arrangement direction 20 of the short lead wire 9 and the long lead wire 10 crosses the optical axis direction of the first light ray 3 or the second light ray 7. Accordingly, the first light ray 3 and the second light ray 7 are not blocked at the same time by the short lead wire 9 and the long lead wire 10 which pass through the first light ray 3 and the second light ray 7.

(3) The decrease amount of the received light amount of the first light receiver 2 and the second light receiver 6 obtained by the above (2) is compared with each limit decrease amount obtained by the above (1).

As a result of the comparison, if the decrease amount in the amount of received light of at least one of the first light receiver 2 and the second light receiver 6 is smaller than the limit decrease amount, it is determined that there is an abnormality in the lead wire of the electric component 11. Note that, the decrease amount and the limit decrease amount in the amount of received light are not limited to the decrease amount in the light intensity of received light itself, but may include a relative value, a relative ratio, a relative decrease value, a relative decrease ratio, and the like with respect to the light intensity when the lead wire is normal.

Note that, the electric component 11 determined to have no abnormality in any lead wire by the above method is incorporated into a circuit board, an electric product or the like on the work table 14 by the articulated robot 13.

The component inspecting device and method according to this embodiment has an effect that the presence or absence of abnormality of the lead wire can be detected in a short time only by a simple linear movement operation, by employing a simple configuration using the simple first light receiver 2 and the second light receiver 6 which obtains the light intensity respectively, as a first light measuring device 4 and a second light measuring device 8.

Note that, in the above description of the first embodiment, for the sake of convenience of explanation and ease of understanding, the electric component 11 in a state in which the axis direction of the two lead wires is oriented vertically downward is linearly moved within a horizontal plane which is in a direction orthogonal to the axis direction of the lead wire to detect the presence or absence of abnormality of the lead wire and furthermore the electric component 11 is moved in the horizontal plane by the articulated robot for simplifying the system and the like.

However, the axis of the two lead wires is not limited to the vertically downward orientation, and it is obvious from the above detection principle that the presence or absence of abnormality of the lead wire can be detected by linearly moving the electric component 11 oriented in any direction in a plane orthogonal to the axis direction of the lead wire. In that case, the electric component 11 can be moved in the orthogonal plane using a six-axis articulated robot, for example. In this case, in the above description of the first embodiment, for example, "the lead wire vertically downward" can be read as "the tip end of the lead wire in any direction", and "moving linearly in the horizontal plane" can be read as "moving linearly in a plane perpendicular to the axis direction of the lead wire". Note that, this also applies to the second or third embodiment which will be described later.

Note that, as the robot used in the first embodiment described above and the second and third embodiments described later, various robots such as a vertical articulated robot and a horizontal articulated robot can be used, and the form of the robot is not particularly limited.

Second Embodiment

Hereunder, a second embodiment of the component inspecting device and method according to the present invention will be described referring to the drawings. Note that, in the following, matters different from those in the first embodiment will be mainly described, and matters not specifically described are the same as those in the first embodiment unless there is contradiction or the like.

Figure 5:
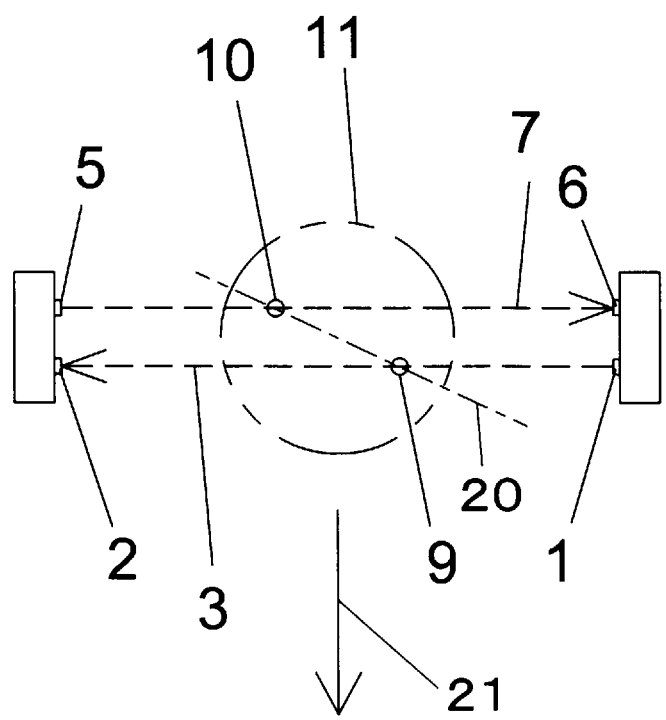
FIG. 5 is a plan view illustrating the relationship between the lead wires and light rays in the second embodiment.
Figure 6:
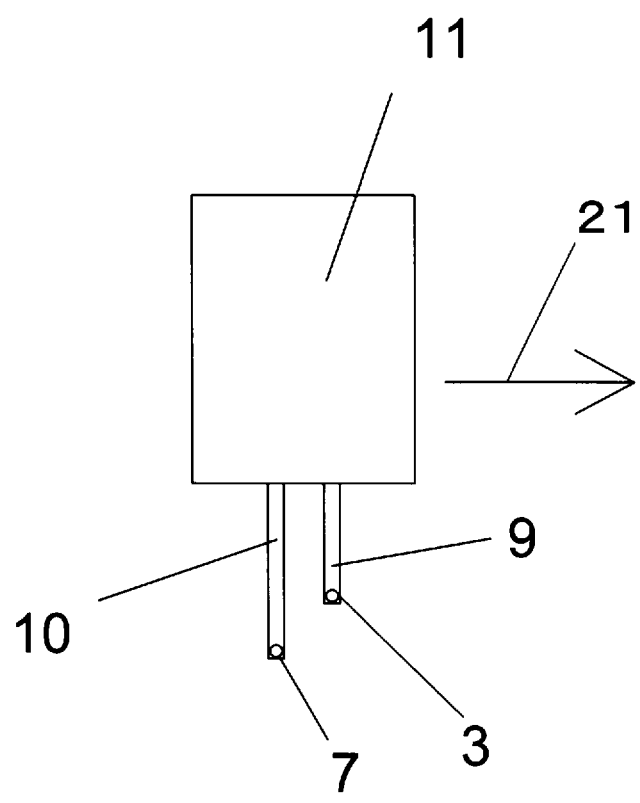
FIG. 6 is a left side view illustrating the relationship between the lead wires and light rays in the second embodiment.

FIG. 5 is a plan view illustrating the relationship between lead wires and light rays (first light ray 3 and second light ray 7) in the second embodiment, and FIG. 6 is a left side view illustrating the relationship between the lead wires and the light rays (first light ray 3 and second light ray 7) in the second embodiment.

When the electric component 11 linearly moves in the horizontal cross section, in the first embodiment, the time points at which the short lead wire 9 and the long lead wire 10 block the first light ray 3 and the second light ray 7 respectively are different. While, in the second embodiment, the distance between the first light ray 3 and the second light ray 7 in the horizontal cross section and the crossing angle of the arrangement direction 20 of the lead wire 9 and the lead wire 10 with respect to the center axis direction of the first light ray 3 or the second light ray 7 are set so that the time points at which the short lead wire 9 and the long lead wire 10 block the first light ray 3 and the second light ray 7 respectively are almost the same.

Accordingly, changes in the amount of light of the first light ray 3 and the second light ray 7 which are blocked by the lead wire 9 and the lead wire 10 respectively can be acquired almost at the same time. Further, since the horizontal movement distance is shortened, the time required for detecting abnormality of the lead wire can be shortened.

Note that, in FIG. 5, the electric component 11 is set to linearly move from the upper side of the page toward the lower side of the page (in FIG. 6, it moves from the left side of the page toward the right side of the page). In contrast, in FIG. 5, the electric component 11 may be set to linearly move from the lower side of the page toward the upper side of the page (in FIG. 6, the electric component 11 moves from the right side toward the left side of the page) while the arrangement of the first light ray 3 and the second light ray 7 is the same.

Next, a method of detecting abnormality of the short lead wire 9 and the long lead wire 10 of the electric component 11 by using the component inspecting device 15 will be described.

(1) The change amount (decrease amount) in the amount of received light received by the light receiver (first light receiver 2 and second light receiver 6) corresponding to a bend and the like which are determined to be abnormal in the lead wires (short lead wire 9 and long lead wire 10) is obtained by calculation, analysis or experiment.

Note that, since the arrangement direction 20 of the short lead wire 9 and the long lead wire 10 is arranged in a direction crossing the irradiation direction of the first light ray 3 or the second light ray 7, the first light ray 3 does not pass through the short lead 9 and the long lead 10 at the same time. Accordingly, even if the short lead wire 9 is largely deformed, an erroneous judgment will not be made due to blocking of the first light ray 3 by the long lead wire 10.

(2) The electric component 11 is linearly moved in the horizontal plane so that the short lead wire 9 and the long lead wire 10 respectively block the first light ray 3 and the second light ray 7 to obtain the change in the amount of received light (decrease amount) received by the first light receiver 2 and the second light receiver 6.

(3) The decrease amount of the received light amount of the first light receiver 2 and the second light receiver 6 obtained by the above (2) is compared with each limit decrease amount obtained by the above (1). If the decrease amount in the amount of received light of at least one of the first light receiver 2 and the second light receiver 6 is smaller than the limit decrease amount, it is determined that there is an abnormality in the lead wire of the electric component 11.

Third Embodiment

Hereunder, a third embodiment of the inspecting device according to the present invention will be described referring to the drawings. Note that, in the following, matters different from those in the first or second embodiment will be mainly described, and matters not specifically described are the same as those in the first or second embodiment unless there is contradiction or the like.

Figure 7:
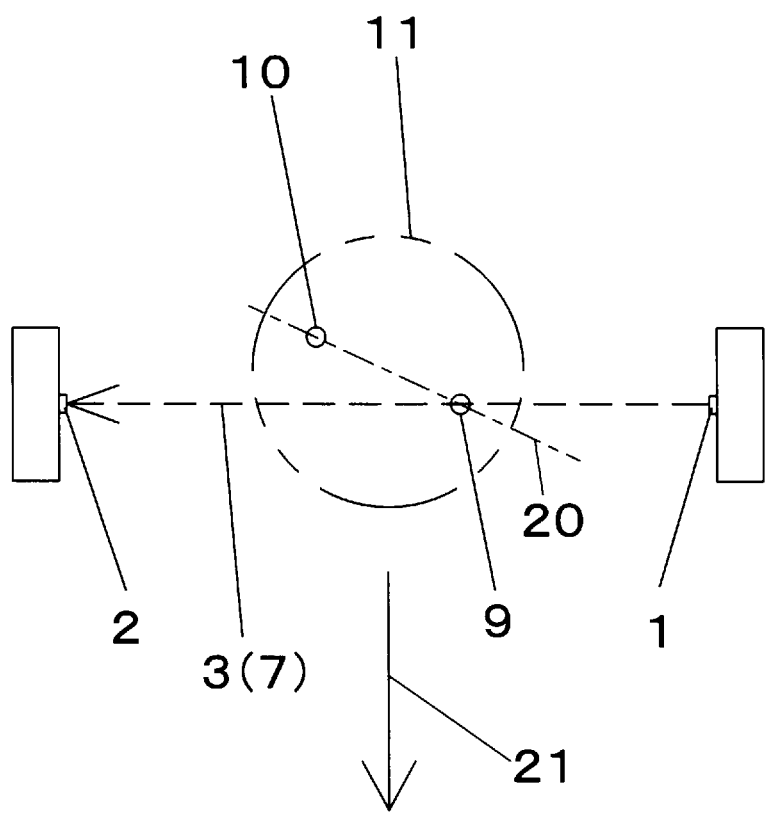
FIG. 7 is a plan view illustrating the relationship between the lead wires and light rays in the third embodiment.
Figure 8:
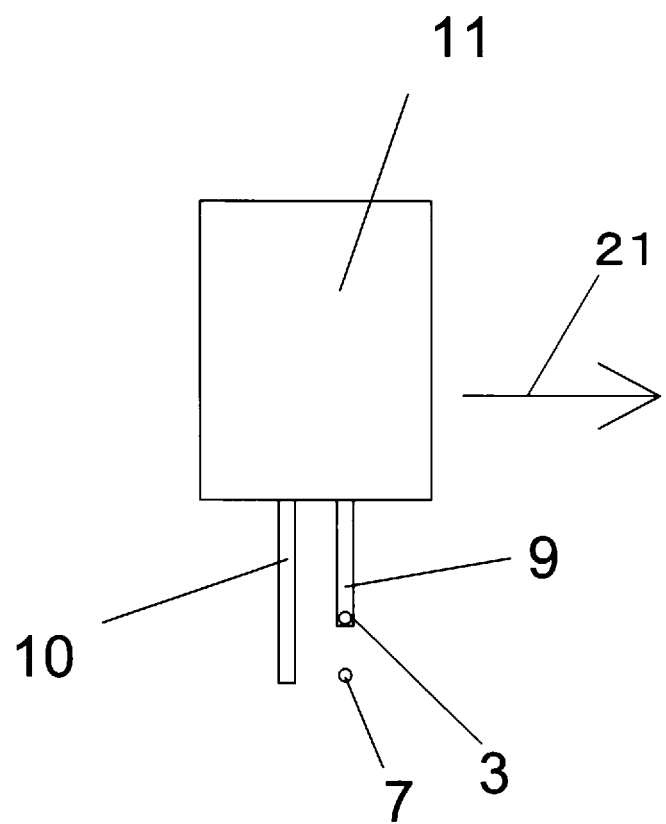
FIG. 8 is a left side view illustrating the relationship between the lead wires and light rays in the third embodiment.

FIG. 7 is a plan view illustrating the relationship between lead wires (short lead wire 9 and long lead wire 10) and light rays (first light ray 3 and second light ray 7) in the third embodiment, and FIG. 8 is a left side view illustrating the relationship between the lead wires (short lead wire 9 and long lead wire 10) and the light rays (first light ray 3 and second light ray 7) in the third embodiment.

In the first and second embodiments, the second light ray 7 is arranged obliquely below the first light ray 3 (refer to FIG. 4, and FIG. 6), while, in the third embodiment, the second light ray 7 is arranged vertically below the first light ray 3 (refer to FIG. 8).

Even when the second light ray 7 is arranged vertically below the first light ray 3 as above, since the electric component 11 is moved in a posture in which the arrangement direction 20 of the short lead wire 9 and the long lead wire 10 crosses the irradiation direction of the first light ray 3 or the second light ray 7 (refer to FIG. 7), the first light ray 3 does not pass through the short lead wire 9 and the long lead wire 10 at the same time. Accordingly, even if the short lead wire 9 is largely deformed, an erroneous judgment will not be made due to blocking of the first light ray 3 by the long lead wire 10.

The method of detecting abnormality of the short lead wire 9 and the long lead wire 10 of the electric component 11 using the component inspecting device 15 in the third embodiment is basically the same as in the first or second embodiment.

DESCRIPTION OF REFERENCE NUMERALS

1 . . . first light projector
2 . . . first light receiver
3 . . . first light ray
4 . . . first light measuring device
5 . . . second light projector
6 . . . second light receiver
7 . . . second light ray
8 . . . second light measuring device
9 . . . short lead wire
10 . . . long lead wire
11 . . . electric component
12 . . . gripper
13 . . . articulated robot
14 . . . work table
15 . . . component inspecting device
20 . . . arrangement direction
21 . . . movement direction of electric component

The invention claimed is:
1. A component inspecting device for inspecting a component having two linear wires which have axis directions parallel to each other and have different lengths, comprising:
a moving device for holding and linearly moving the component in a direction substantially orthogonal to the axis direction of one the two linear wires;
a first light measuring device having a first light projector for irradiating a first light ray to a position of a tip end portion of a short wire among the two linear wires in a normal state, and a first light receiver for receiving the first light ray; and a second light measuring device having a second light projector for irradiating a second light ray whose optical axis is parallel to the first light ray to a position of a tip end portion of a long wire among the two linear wires in a normal state, and a second light receiver for receiving the second light ray;

wherein the component inspecting device is configured to inspect presence or absence of an abnormal state of the two linear wires based on changes in an amount of received light of the first light ray and the second light ray received by the first light receiver and the second light receiver, respectively, when the component is moved such that the two linear wires in the normal state block the first light ray and the second light ray in a posture in which an arrangement direction of the two linear wires crosses optical axes of the first light ray and the second light ray.

2. The component inspecting device according to claim 1, wherein an irradiation direction of the first light ray and an irradiation direction of the second light ray are set opposite to each other.

3. The component inspecting device according to claim 1, wherein a gap between the short wire and the long wire in a direction that the component is linearly moved is twice or more a width of the first light ray or the second light ray.

4. The component inspecting device according to claim 1, wherein the moving device is a robot for holding the component and performing an assembly work.

5. The component inspecting device according to claim 1, wherein the component is an electric component and the linear one of the two linear wires is a lead wire having a polarity of the electric component.

6. A component inspecting method for inspecting a component having two linear wires which have axis directions parallel to each other and have different lengths, comprising:

a moving step of linearly moving the component in a direction substantially orthogonal to the axis direction of one of the two linear wires;

a first light measuring step of irradiating a first light ray to a position of a tip end portion of a short wire among the two linear wires in a normal state to obtain a change in an amount of received light of the first light ray blocked by the short wire;

a second light measuring step of irradiating a second light ray whose optical axis is parallel to the first light ray to a position of a tip end portion of a long wire among the two linear wires in a normal state to obtain a change in an amount of received light of the second light ray blocked by the long wire; and a determining step of determining presence or absence of an abnormality of the two linear wires based on changes in the amount of received light of the first and second light rays obtained by the first and second light measuring steps, respectively, wherein, in the moving step, the component is moved in a posture in which an arrangement direction of the two linear wires crosses optical axes of the first light ray and the second light ray, and the first and second light measuring steps are executed in parallel with the moving step.

7. The component inspecting method according to claim 6, wherein an irradiation direction of the first light ray and an irradiation direction of the second light ray are set opposite to each other.

8. The component inspecting method according to claim 6, wherein a gap between the short wire and the long wire in a direction that the component is linearly moved is twice or more a width of the first light ray or the second light ray.

9. The component inspecting method according to claim 6, further comprising:

a limit decrease amount obtaining step of, before the moving step, for each of the short wire and the long wire, obtaining in advance a decrease amount in an amount of received light of the first light ray and the second light ray in a maximum allowable deformation amount of the tip end portion of the linear wire when the component is moved so that the two linear wires block the first light ray and the second light ray as a limit decrease amount, wherein in the determining step, it is determined as abnormal when the decrease amount in the amount of received light of at least one of the first light ray and the second light ray is smaller than the limit decrease amount.

10. The component inspecting method according to claim 6, wherein the moving step is executed by a robot for holding the component and performing an assembly work.

11. The component inspecting method according to claim 6, wherein the component is an electric component and the linear wire is a lead wire having a polarity.

* * * * *